(12) United States Patent
Bingi et al.

(10) Patent No.: US 8,867,216 B2
(45) Date of Patent: Oct. 21, 2014

(54) SLOT DESIGN FOR FLEXIBLE AND EXPANDABLE SYSTEM ARCHITECTURE

(75) Inventors: Ravi B. Bingi, Austin, TX (US); Ranger H. Lam, Austin, TX (US); Jason R. Talbert, Austin, TX (US); Pravind K. Hurry, Austin, TX (US); Brian E. Longhenry, Austin, TX (US); Andrew W. Steinbach, Austin, TX (US); Jeff H. Gruger, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 492 days.

(21) Appl. No.: 13/079,912

(22) Filed: Apr. 5, 2011

(65) Prior Publication Data

US 2012/0258611 A1  Oct. 11, 2012

(51) Int. Cl.
*H05K 1/00* (2006.01)
*G06F 13/40* (2006.01)

(52) U.S. Cl.
CPC .................................. *G06F 13/409* (2013.01)
USPC .............. 361/748; 439/55; 174/250; 174/261

(58) Field of Classification Search
USPC ...................... 361/748; 439/55; 174/250, 261
See application file for complete search history.

(56) References Cited

U.S. PATENT DOCUMENTS

| | | | | |
|---|---|---|---|---|
| 6,600,642 | B1* | 7/2003 | Karnes | 361/119 |
| 7,673,092 | B2* | 3/2010 | Zhao et al. | 710/313 |
| 2009/0006709 | A1 | 1/2009 | Zhao et al. | |
| 2011/0063790 | A1* | 3/2011 | Park et al. | 361/679.31 |

OTHER PUBLICATIONS

International Search Report and Written Opinion, mailed Aug. 2, 2012 in PCT/US2012/031350 (8 pages).

* cited by examiner

*Primary Examiner* — Andargie M Aychillhum
(74) *Attorney, Agent, or Firm* — Abel Law Group, LLP

(57) ABSTRACT

An apparatus includes a printed circuit board including a connector footprint comprising a first footprint portion operative to receive a first connector portion and a second footprint portion operative to receive a second connector portion. The first footprint portion is compliant with a first communications link type and the first and second footprint portions are jointly compliant with a second communications link type. The printed circuit board includes first conductive traces coupled to the first footprint portion and a first device footprint. The first conductive traces are selectively configurable according to a selected one of the first and second communications link types. The printed circuit board includes a second conductive traces coupled to the second footprint portion and the first device footprint. In at least one embodiment of the apparatus, the first communications link type is AC-coupled and the second communications link type is DC-coupled.

14 Claims, 4 Drawing Sheets

SLOT DESIGN FOR FLEXIBLE AND EXPANDABLE SYSTEM ARCHITECTURE

BACKGROUND

1. Field of the Invention

The invention is related to computing systems and more particularly to connections in computing systems.

2. Description of the Related Art

In general, devices in a computing system communicate via a logical connection called an interconnect or link. A typical link compliant with an exemplary link protocol is a point-to-point communication channel between two ports including one or more lanes. An individual lane is composed of a transmit and receive pair of lines. The lines may be single-ended lines or differential lines. In at least one embodiment of a link, each lane includes a transmit and receive pair of differential lines, i.e., each lane includes four signal paths between endpoints of the link, to support full duplex communications. An exemplary low-speed device uses a single-lane link, while an exemplary higher-speed device (e.g., graphics adapter) uses a much wider, multi-lane link.

In at least one embodiment, a link implements serial communications, which is less affected by timing skew as compared to parallel communications links since serial links do not require that the bits of a particular word of data arrive at their destination simultaneously. The technique of serial communications sends data one bit at a time, sequentially over the communication link. Exemplary serial communications links include Peripheral Component Interconnect Express (PCIE), HyperTransport (formerly known as Lightning Data Transport), Serial Advanced Technology Attachment (Serial ATA), universal serial bus (USB), IEEE 1394 interface, Serial RapidIO, and Serial Attached Small Computer System Interface (SAS)). In at least one embodiment of a processing system, more than one type of serial communications link is used (e.g., PCIE and HyperTransport). HyperTransport is a protocol for interconnection of computer processors using a bidirectional, serial, high-bandwidth, low-latency, point-to-point link. A typical HyperTransport link supports bit widths that range from two to thirty-two bits. However, a HyperTransport link requires sideband control and command signals. In addition, HyperTransport is a DC-coupled link. Peripheral Component Interconnect Express (PCIE) is a computer expansion card standard, typically used as a board-level interconnect (e.g., to link to motherboard mounted peripherals) and used as an expansion card interface for add-in boards. Typical PCIE slots contain from one to sixteen lanes and are AC-coupled. Each lane typically includes one pair of transmit differential signals and one pair of receive differential signals. In general, HyperTransport and PCIE links support substantially the same data rates.

An exemplary processing system includes a printed circuit board assembly (e.g., motherboard, backplane, or other printed circuit board assembly) having an expansion slot (i.e., slot) for adding functionality to the processing system. An exemplary expansion board (i.e., expansion card, adapter card, or accessory card) includes a device (e.g., processor or peripheral device). In at least one embodiment, an expansion slot couples a component (e.g., a device or an expansion board) to the printed circuit board using a connector that is compliant with a communications link protocol used by a processor or device on the printed circuit board assembly and used by the component.

In at least one embodiment, the processing system and connector are included in a blade server. As referred to herein, a blade server (i.e., blade) is a printed circuit board assembly including a processor, memory, I/O, and non-volatile storage elements. A typical blade server has a modular design that reduces the use of physical space and energy as compared to other server systems. A typical blade enclosure includes multiple blades to form a blade system and provides one or more of power, cooling, networking, interconnects, and management for the system. A manufacturer packages a complete server with its operating system and applications on a single blade. The blade can operate independently within a chassis common to multiple blades.

SUMMARY OF EMBODIMENTS OF THE INVENTION

In at least one embodiment of the invention, an apparatus includes a printed circuit board including a connector footprint comprising a first footprint portion operative to receive a first connector portion and a second footprint portion operative to receive a second connector portion. The first footprint portion is compliant with a first communications link type and the first and second footprint portions are jointly compliant with a second communications link type. The printed circuit board includes first conductive traces coupled to the first footprint portion and a first device footprint. The first conductive traces are selectively configurable according to a selected one of the first and second communications link types. The printed circuit board includes a second conductive traces coupled to the second footprint portion and the first device footprint. In at least one embodiment of the apparatus, the first communications link type is AC-coupled and the second communications link type is DC-coupled.

In at least one embodiment of the invention, a method of manufacturing a printed circuit board assembly includes configuring conductive traces coupled to a connector footprint and a device footprint on a printed circuit board according to a communications link type associated with a device received by the connector. The conductive traces are capable of being configured to couple the device footprint to the connector footprint according to a first communications link type and are capable of being configured to couple the device footprint to the connector according to a second communications link type. In at least one embodiment of the method, the first communications link type is Peripheral Component Interconnect Express (PCIE) and the second communications link type is HyperTransport (HT).

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
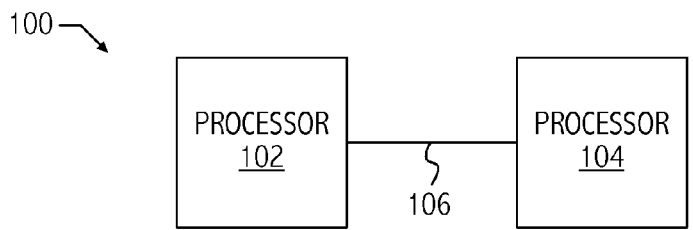
FIG. 1 illustrates an exemplary multiprocessor processing system.
Figure 2:
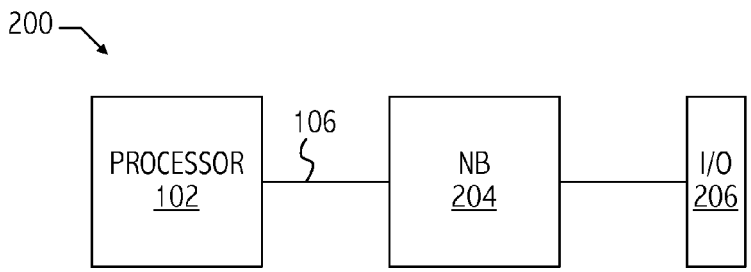
FIG. 2 illustrates an exemplary processing system including a peripheral device.
Figure 3:
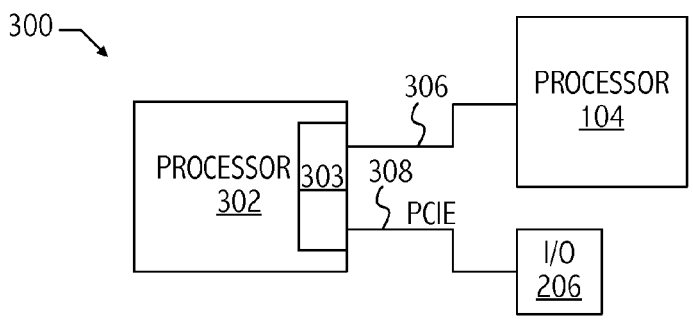
FIG. 3 illustrates an exemplary multiprocessor processing system including a peripheral device.

Referring to FIG. 1, in an exemplary processing system (e.g., processing system 100), processors (i.e., central processing unit(s), core(s), and/or hardware accelerator(s), e.g., processors 102 and 104) are coupled to each other using a link (e.g., link 106). In at least one embodiment of system 100, link 106 is a HyperTransport link. Referring to FIG. 2, in exemplary processing system 200, rather than coupling processor 102 to another processor, link 106 couples processor 102 to an integrated circuit (e.g., integrated circuit 204) that handles communications between processor 102 and one or more peripheral devices or other integrated circuits (e.g., I/O 206). In at least one embodiment, integrated circuit 204 is a Northbridge circuit. Referring to FIG. 3, system 300 includes a processor (e.g., processor 302) having an interface circuit (e.g., Northbridge 303) that integrates Northbridge functionality into the processor.

In an exemplary system, a processor (e.g., processor 102) is connected to a printed circuit board having a fixed number of slots for components (i.e., expansion printed circuit boards or devices) that couple to the processor. For example, the printed circuit board includes m slots for coupling components including another processor to processor 102 and n slots for coupling components including I/O devices to processor 102. As referred to herein, a slot on a printed circuit board includes a connector, one or more pads or holes for electrically coupling to the connector configured in a pattern consistent with a footprint of the connector, and conductive traces on the printed circuit board coupled to the pattern of pads or holes. The connector, pads or holes, and conductive traces on the printed circuit board may be formed by any suitable manufacturing technique. In general, a connector is a mechanical component that provides mechanical and electrical connections between a component and another component. A connector for receiving a device may be referred to as a socket and may include a lever or latch for physically securing the device in the connector. A typical connector includes plastic and metal contacts for each of the electrical leads, pins, or lands of the component. Note that each slot is configured for a particular type of communications link. That is, a slot configured to communicate with a component using a first link type is not configured to communicate with a component using the second link type. Similarly, slots configured to communicate with a component using the second link type are not configured to communicate with components using the first link type. For example, in at least one embodiment, processor 302 includes interfaces to communicate over a link of a first type (e.g., PCIE link 308) to a peripheral device (e.g., I/O 206) and a link of a second type (e.g., HyperTransport link 306) to a processor (e.g., processor 104). However, a printed circuit board assembly including processor 302 includes one or more slots dedicated to a particular type of link.

Figure 4:
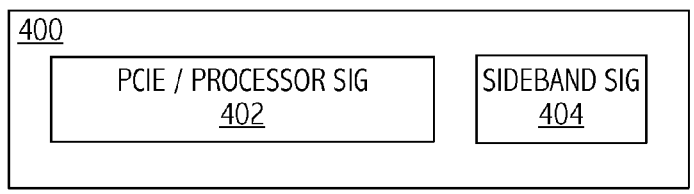
FIG. 4 illustrates a connector consistent with at least one embodiment of the invention.

In at least one embodiment of a printed circuit board assembly, rather than including on a printed circuit board multiple busses compliant with different link types for coupling a processor to another device which may be compliant with one or another of the different link types, the printed circuit board includes a flexible bus that may be used with either link type. In at least one embodiment of the printed circuit board assembly, a flexible connector is coupled to that flexible bus on the printed circuit board. Referring to FIG. 4, the flexible connector includes enough electrical contacts and leads for the widest of the two link types (e.g., 20 lanes for an exemplary HyperTransport link). For example, electrical connector 400 includes two connector portions. A first connector portion (e.g., portion 402) includes contacts to support a PCIE slot (e.g., 16 lanes). A second connector portion (e.g., portion 404) includes additional contacts for additional signals (e.g., four lanes for HyperTransport and sideband signals) required by the HyperTransport slot. A PCIE component can plug into the first connector portion and the second connector portion is unused. A component compliant with a HyperTransport link can plug into both portions of the connector. Thus, the same socket may be used to couple components compliant with either type of link, providing flexibility to expand a system architecture implemented by an exemplary printed circuit board assembly.

Figure 5:
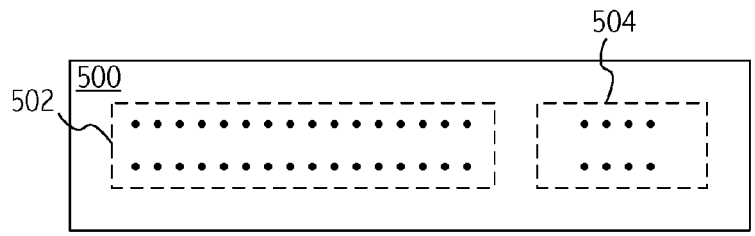
FIG. 5 illustrates a connector footprint consistent with at least one embodiment of the invention.

Referring to FIG. 5, in at least one embodiment, a printed circuit board includes a landing pattern (e.g., landing pattern 500) consistent with a footprint of a flexible connector, as described above. In at least one embodiment, the landing pattern includes electrical contacts (e.g., pads or holes) spaced to receive corresponding electrical leads of the flexible connector. In at least one embodiment, landing pattern 500 includes a first landing pattern portion (e.g., landing pattern portion 502) and a second landing pattern portion (e.g., landing pattern portion 504) that correspond to connector portions 402 and 404, respectively. Note that the landing pattern 500 may have any geometry and configuration suitable to electrically couple electrical leads of a corresponding connector to conductors on the printed circuit board.

Figure 6:
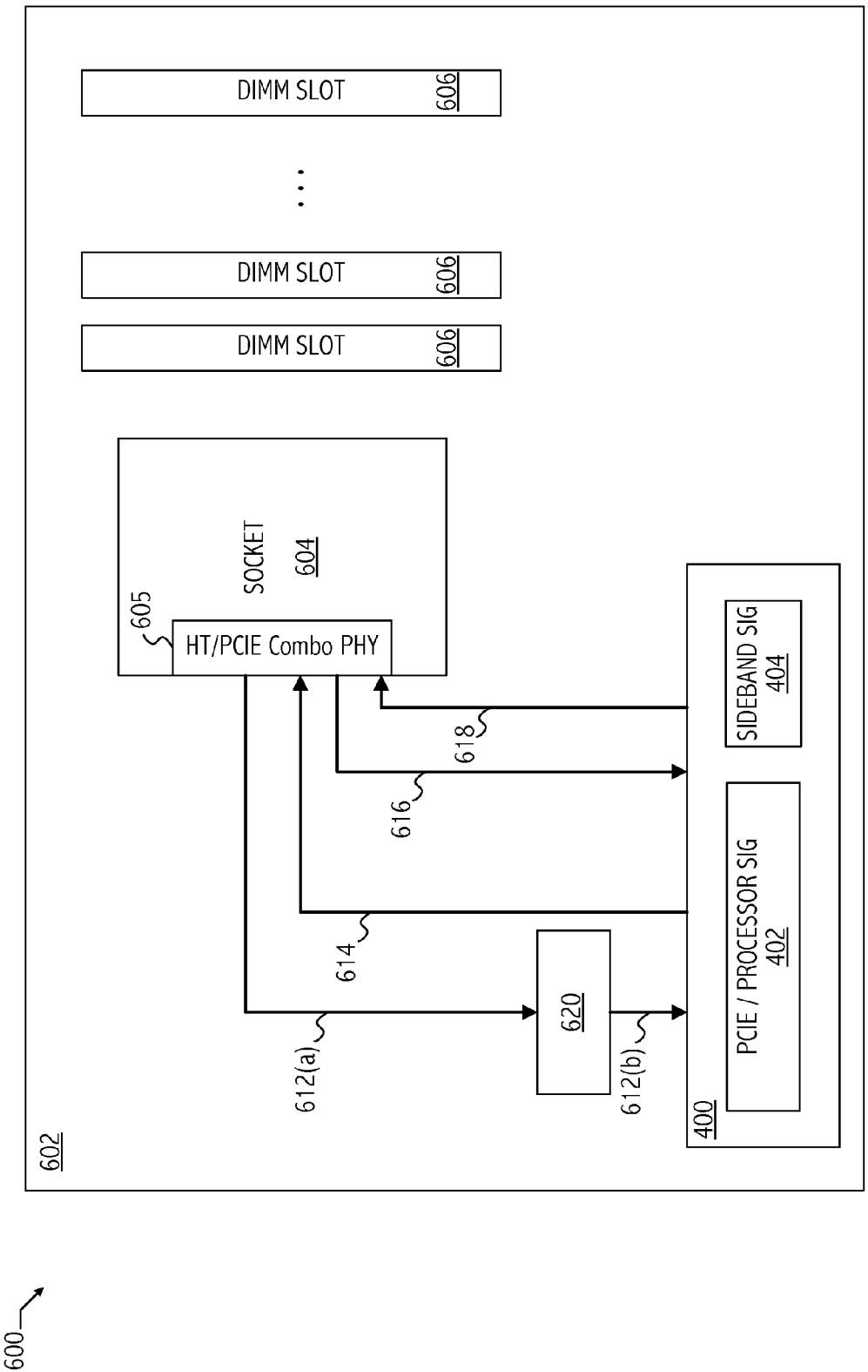
FIG. 6 illustrates an exemplary processing system including the connector of FIG. 4 consistent with at least one embodiment of the invention.

Referring to FIG. 6, a printed circuit board assembly (e.g., printed circuit board assembly 600) includes a printed circuit board (e.g., printed circuit board 602) populated with a socket (e.g., socket 604 including an interface, e.g., interface 605) for a processor including an integrated PCIE/HyperTransport interface, memory slots (e.g., dual in-line memory module slots 606), and a flexible expansion slot including a flexible bus (e.g., a bus including conductive traces 612, 614, 616, and 618) and a flexible connector (e.g., connector 400). In at least one embodiment, printed circuit board assembly 600 is further populated with a processor in socket 604, and a component connected to connector 400. In at least one embodiment, conductive traces (e.g., traces 612) couple lanes of the interface that communicate signals from interface 605 to connector 400 and conductive traces (e.g., traces 614) couple lanes of the interface that communicate signals from connector 400 to interface 605. A circuit (e.g., circuit 620) includes components that are selectively configured and/or populated according to the type of interface required by a particular embodiment of printed circuit board assembly 600. In at least one embodiment, circuit 620, which is coupled between conductive trace portions 612($a$) and 612($b$), is populated with switches, capacitors, resistors, and/or jumpers that are configured to implement AC coupling for a PCIE link or DC coupling for a HyperTransport link. In at least one embodiment of printed circuit board 602, conductive traces 616 and 618 are also included to couple sideband signals of a HyperTransport link between connector 400 and socket 604. Accordingly, a flexible slot of printed circuit board assembly 600 is configured to receive a component consistent with either a PCIE link or a HyperTransport link. That is, the flexible slot of printed circuit board assembly 600 is configured to receive a connector compliant with a communications interface consistent with either of the PCIE or HyperTransport protocols.

Figure 7:
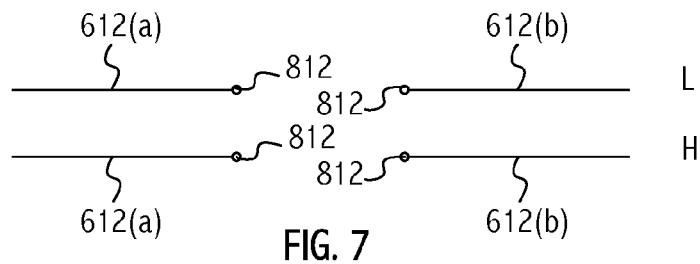
FIG. 7 illustrates exemplary conductive traces of a link on a printed circuit board consistent with at least one embodiment of the invention.

Referring to FIGS. 6 and 7, in at least one embodiment of printed circuit board 602, conductive trace portions 612(a) and 612(b) include connection points 812 for coupling one or more circuit elements to conductive trace 612. In at least one embodiment, connection points 812 of a particular conductive trace 612 are separated by a gap for serially coupling a circuit element to conductive trace portions 612(a) and 612(b). A technique for manufacturing printed circuit board assembly 600 includes coupling a circuit (e.g., circuit 620) to conductive trace portions 612(a) and 612(b) according to a target communication link for the printed circuit board assembly.

Figure 8A:
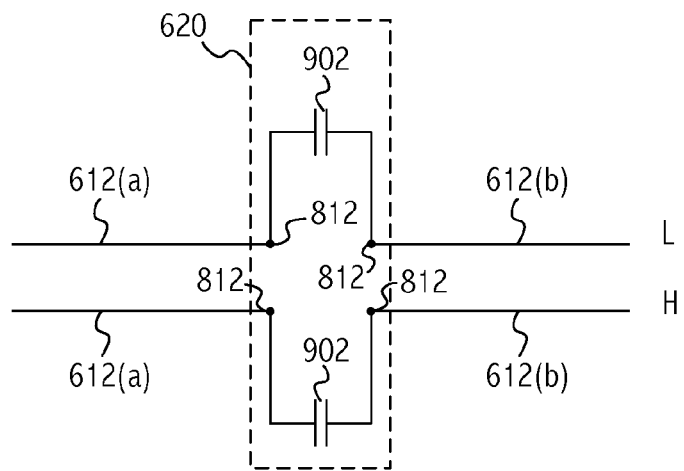
FIG. 8A illustrates an exemplary configuration of the conductive traces of FIG. 7 consistent with at least one embodiment of the invention.
Figure 8B:
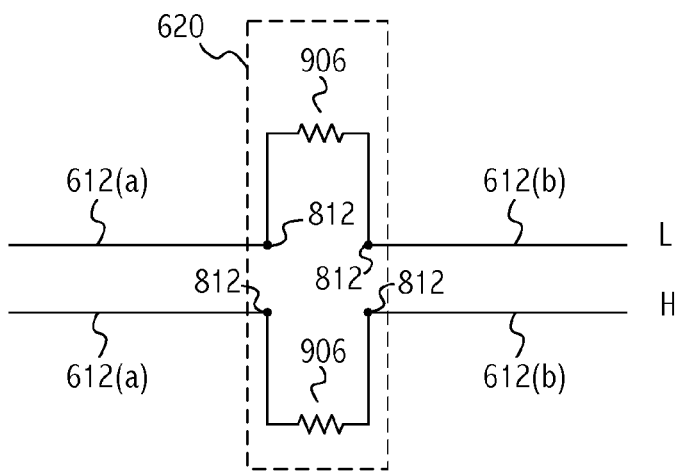
FIG. 8B illustrates an exemplary configuration of the conductive traces of FIG. 7 consistent with at least one embodiment of the invention.

Referring to FIGS. 6 and 8A, in at least one embodiment, circuit 620 includes at least one capacitor for coupling in series with conductive trace 612. In at least one embodiment, circuit 620 includes capacitors 902 and circuit 620 is coupled to connection points 812 to thereby capacitively couple (i.e., AC couple) conductive trace portions 612(a) and 612(b). Referring to FIG. 8B, in at least one embodiment of circuit 620, interface 605 is DC-coupled to connector 400, conductive trace portions 612(a) and 612(b) are DC-coupled, and resistive conductors (e.g., zero Ohm resistors 906) are used instead of capacitors 902.

Figure 9:
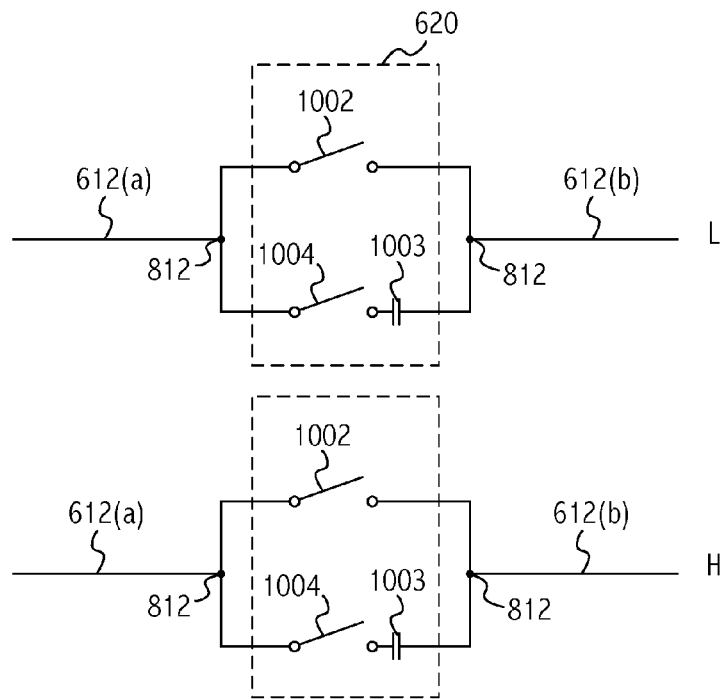
FIG. 9 illustrates an exemplary configuration of the conductive traces of FIG. 7 consistent with at least one embodiment of the invention.
Figure 10:
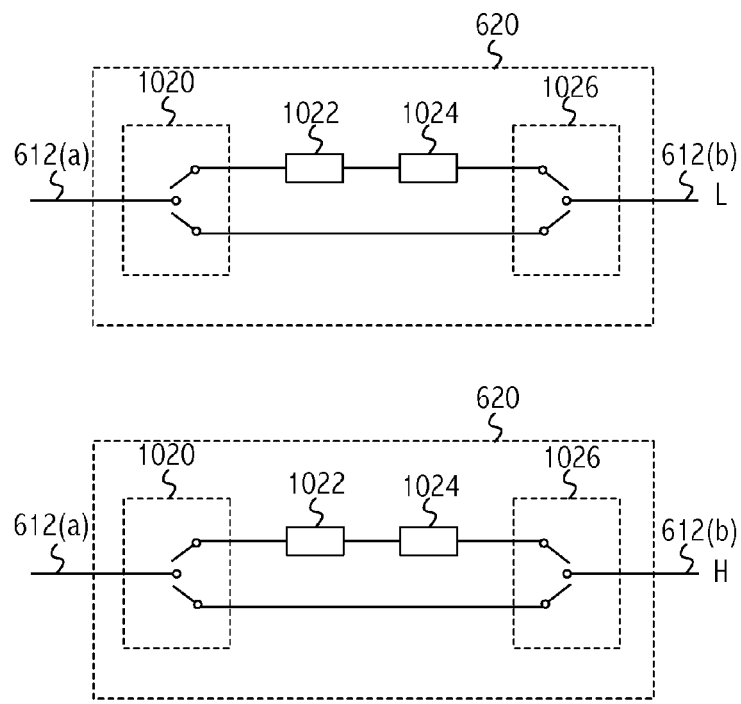
FIG. 10 illustrates an exemplary configuration of the conductive traces of FIG. 7 consistent with at least one embodiment of the invention.

Referring to FIGS. 6 and 9, in at least one embodiment, circuit 620 includes one or more analog switches for coupling in series with conductive traces 612. In at least one embodiment, a technique for manufacturing a printed circuit board assembly includes using those switches to selectively couple conductive trace portions 612(a) and 612(b) according to a particular link type. For example, to configure printed circuit board 602 for a DC-coupled link, switches 1002 are closed and switches 1004 are open, effectively resistively coupling circuit portions 612(a) and 612(b) to each other. To configure printed circuit board 602 for an AC-coupled link, switches 1002 are open and switches 1004 are closed, effectively capacitively coupling circuit portions 612(a) and 612(b) to each other using capacitor 1003. Note that the embodiment of FIG. 9 is exemplary only and other circuit elements may be used to couple conductive trace portions 612(a) and 612(b) for AC-coupled and DC-coupled links (e.g., jumpers, zero Ohm resistors, redrivers, or other suitable circuit elements). For example, referring to FIG. 10, in at least one embodiment, circuit 620 includes analog demultiplexer/multiplexer circuits (e.g., switches 1020 and 1026) connected to motherboard capacitors (e.g., capacitor 1024) in one path and direct connected in another path. In at least one embodiment, circuit 620 includes at least one redriver circuit (e.g., redriver 1022) to reduce or eliminate signal reflections.

In at least one embodiment of printed circuit board assembly 600, a processor in socket 604 is capable of communicating by either PCIE or HyperTransport. The processor determines which type of communications link is required by a component coupled to connector 400 using any suitable technique and configures printed circuit board 602 accordingly. For example, the processor may assume one type of link and configure printed circuit board 602 for that link type. If the processor receives an unexpected response (e.g., unexpected voltage level), the processor reconfigures printed circuit board 602 for another type of link, and trains using the other link type. In at least one embodiment of printed circuit board assembly 600, traces 616 and 618 include a clock signal and a control signal for each set of eight data lanes in traces 612 and 614. In at least one embodiment, the processor in socket 604 powers up in HyperTransport mode. The processor uses single-ended control lane receivers to detect DC voltage levels. The processor initializes as HyperTransport links any links including either a clock signal or a control signal driven with a DC voltage level. The processor initializes as PCIE links any link with both the clock lane and the control lane floating.

In at least one embodiment, connector 400 includes a PCIE present pin and/or a HyperTransport present pin, which is set by a component coupled to connector 400 and detected by the system logic to configure the system appropriately. In at least one embodiment of printed circuit board assembly 600, a card plugged into connector 400 generates a control signal (e.g., a control signal not included in conductive trace portions 612(a) and 612(b)) that is used to close switches 1002 and switches 1004 based on the type of communications link needed by the component coupled to connector 400.

Note that connector 400 and its corresponding footprint may have any suitable profile and spacing (e.g., regular density or high density). Although connector 400 has been described as coupling a first component to a second component, in other embodiments, connector 400 couples a first component to multiple components. For example, in at least one embodiment, connector 400 couples a first component to two HyperTransport devices, each operating in ½ bus width mode. In at least one embodiment, connector 400 couples a first HT component to a tunnel card that provides multiple I/O slots for I/O expansion or another processor card to provide processing capability expansion or memory expansion.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

The description of the invention set forth herein is illustrative, and is not intended to limit the scope of the invention as set forth in the following claims. For example, while the invention has been described in embodiments including a PCIE and HyperTransport links, one of skill in the art will appreciate that the teachings herein can be utilized with other types of interfaces compliant with different communications link standards. Variations and modifications of the embodiments disclosed herein, may be made based on the description set forth herein, without departing from the scope and spirit of the invention as set forth in the following claims.

What is claimed is:

1. An apparatus comprising:
a printed circuit board comprising:
a pattern of electrical contacts on a first surface of the printed circuit board, the pattern comprising a first portion and a second portion, the first portion being operative to receive a first connector portion and the second portion being operative to receive a second connector portion, the first portion being compliant with a first communications link type and the first and second portions being jointly compliant with a second communications link type;
first conductive traces coupled to the first portion and a first device footprint, the first conductive traces being selectively configurable according to a selected one of the first and second communications link types; and
second conductive traces coupled to the second portion and the first device footprint; and
a connector coupled to the pattern, the connector comprising a first connector portion and a second connector portion, the connector being capable of coupling, according to the first communications link type, the first connector portion to a first device having a first number of terminals and capable of coupling, according to the second communications link type, the first connector portion and the second connector portion to a second device having a second number of terminals, the first number of terminals being less than the second number of terminals.

2. The apparatus, as recited in claim 1, wherein the first communications link type is AC-coupled and the second communications link type is DC-coupled.

3. The apparatus, as recited in claim 1, wherein the first conductive traces are configured to AC couple the first portion and the first device footprint and the second conductive traces are floating.

4. The apparatus, as recited in claim 1, further comprising a first switch coupled to first and second connection points of an individual trace of the first conductive traces.

5. The apparatus, as recited in claim 4, further comprising one of a zero Ohm resistor, jumper, wire, and a capacitor coupled to the first and second connection points.

6. The apparatus, as recited in claim 4, further comprising a second switch coupled in series with a capacitor, the second switch and the capacitor being coupled in parallel to the first switch and coupled to the first and second connection points.

7. The apparatus, as recited in claim 1, further comprising:
a processor connected to the connector.

8. The apparatus, as recited in claim 1, further comprising:
a peripheral device connected to the connector.

9. The apparatus, as recited in claim 1, wherein the first device footprint is capable of receiving a processor including a first interface of the first communications link type and a second interface of the second communications link type.

10. The apparatus, as recited in claim 1, wherein the first communications link type is Peripheral Component Interconnect Express (PCIE) and the second communications link type is HyperTransport (HT).

11. The apparatus, as recited in claim 1, wherein a communications link of the first communications link type and a communications link of the second communications link type are both serial bus communication links.

12. The apparatus, as recited in claim 1, wherein the first communications link type is associated with a first number of signals and the second communications link type is associated with a second number of signals, the first number of signals being less than the second number of signals.

13. An expansion slot of a printed circuit board assembly comprising:
a connector means capable of coupling, according to a first communications link type to a first device having a first number of terminals and capable of coupling, according to a second communications link type to a second device having a second number of terminals, the first number of terminals being less than the second number of terminals;
means for coupling the connector means to a device, the means for coupling being selectively configurable according to a selected one of the first communications link type and the second communications link type, a first set of lanes being used for the first communications link type and the first set of lanes and a second set of lanes being jointly used for the second communications link type.

14. The expansion slot, as recited in claim 13, wherein the first communications link type is AC-coupled and the second communications link type is DC-coupled.

* * * * *